United States Patent [19]

Cirrito et al.

[11] Patent Number: 4,931,905
[45] Date of Patent: Jun. 5, 1990

[54] HEAT PIPE COOLED ELECTRONIC CIRCUIT CARD

[75] Inventors: Vincent Cirrito, Massapequa Park; Kevin J. Koubek, South Setauket; John A. Quadrini, Northport, all of N.Y.

[73] Assignee: Grumman Aerospace Corporation, Bethpage, N.Y.

[21] Appl. No.: 297,526

[22] Filed: Jan. 17, 1989

[51] Int. Cl.⁵ .............................................. H05K 7/20
[52] U.S. Cl. .................................. 361/385; 165/80.4; 165/104.33; 174/15.2; 357/82; 361/382
[58] Field of Search .............................. 29/726, 726.5; 165/80.4, 104.33, 104.34; 174/15.1, 15.2; 357/82; 361/381, 382, 385, 386, 388–389

[56] References Cited

U.S. PATENT DOCUMENTS

| | | |
|---|---|---|
| 2,720,763 | 10/1955 | Doebeli . |
| 3,613,778 | 10/1971 | Feldman, Jr. . |
| 3,651,865 | 3/1972 | Feldmanis .................... 165/80.4 |
| 3,749,156 | 7/1973 | Fletcher et al. . |
| 3,754,594 | 8/1973 | Ferrell . |
| 4,046,190 | 9/1977 | Marcus et al. . |
| 4,118,756 | 10/1978 | Nelson et al. . |
| 4,231,423 | 11/1980 | Haslett . |
| 4,366,526 | 12/1982 | Lijoi et al. . |
| 4,503,483 | 3/1985 | Basiulis ......................... 361/385 |
| 4,602,679 | 7/1986 | Edelstein et al. . |
| 4,777,561 | 10/1988 | Murphy et al. ................. 361/386 |

FOREIGN PATENT DOCUMENTS

| | | |
|---|---|---|
| 57-2985 | 1/1982 | Japan . |
| 0096992 | 6/1983 | Japan ........................ 165/104.33 |
| 565193 | 8/1977 | U.S.S.R. . |

Primary Examiner—Gregory D. Thompson
Attorney, Agent, or Firm—Pollock, VandeSande & Priddy

[57] ABSTRACT

Two metal plates have U-shaped grooves formed therein so that the plates may form congruent halves wherein matching grooves complete independent heat pipes. The bight section of each heat pipe serves as an evaporator section while the parallel arms of each heat pipe form condenser sections. A wick is positioned within each heat pipe to improve liquid transport when a module is in a non-upright position. The condenser sections are located coincident with the normally upright edges of each module so that, when the module is upright, the vertically disposed condenser sections of the heat pipe gravity-assist liquid transport to the evaporator section. This arrangement of heat pipe sections along with the wick render the heat pipe gravity-insensitive.

1 Claim, 2 Drawing Sheets

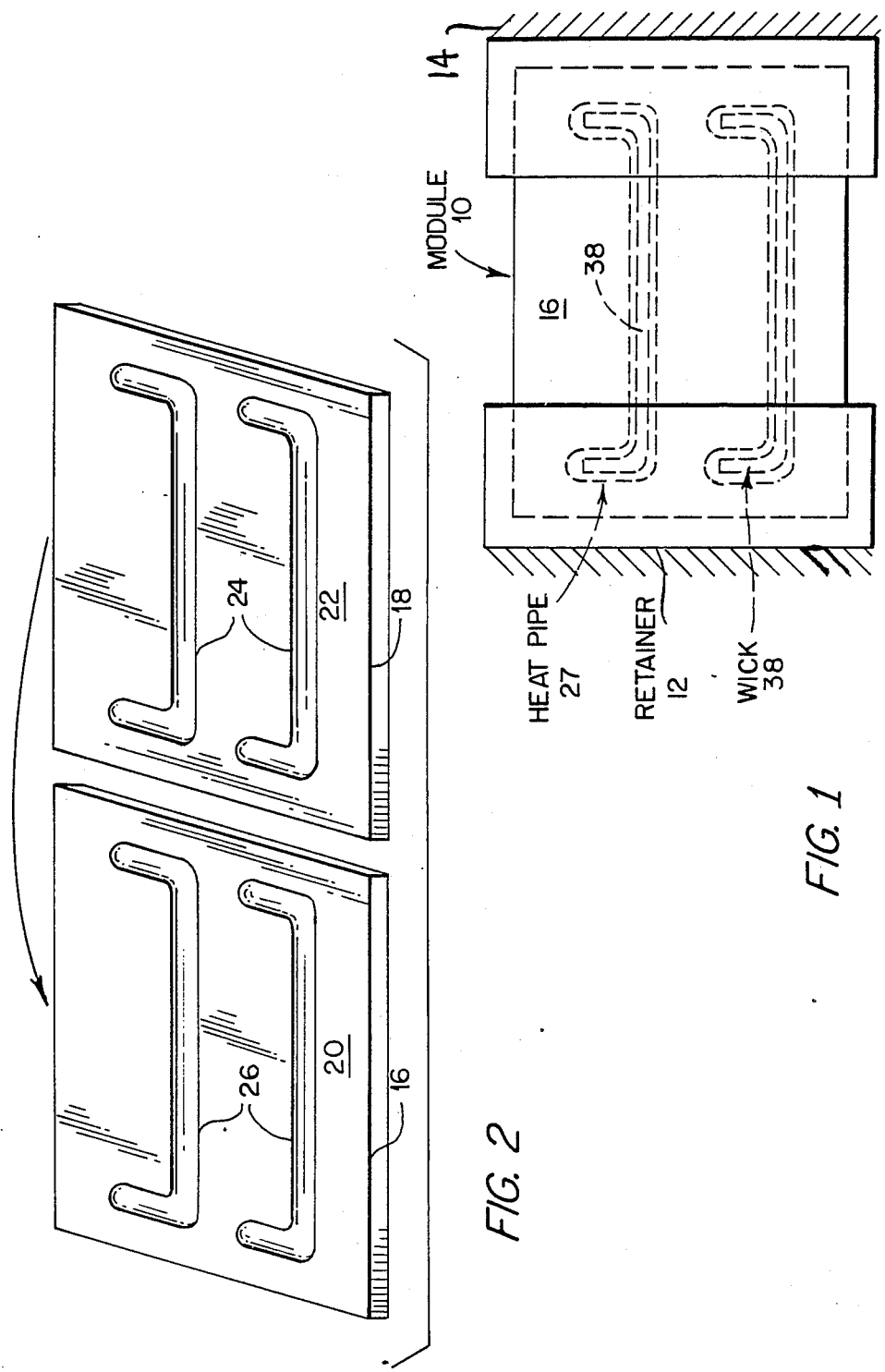

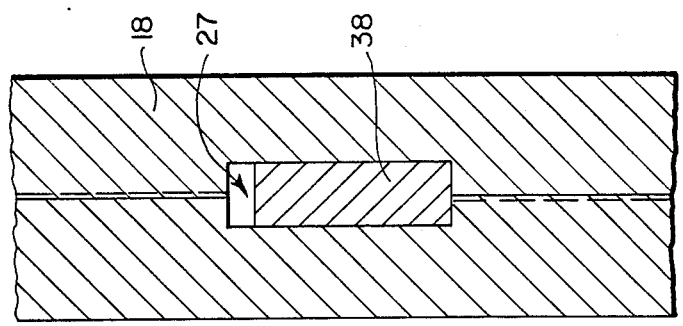
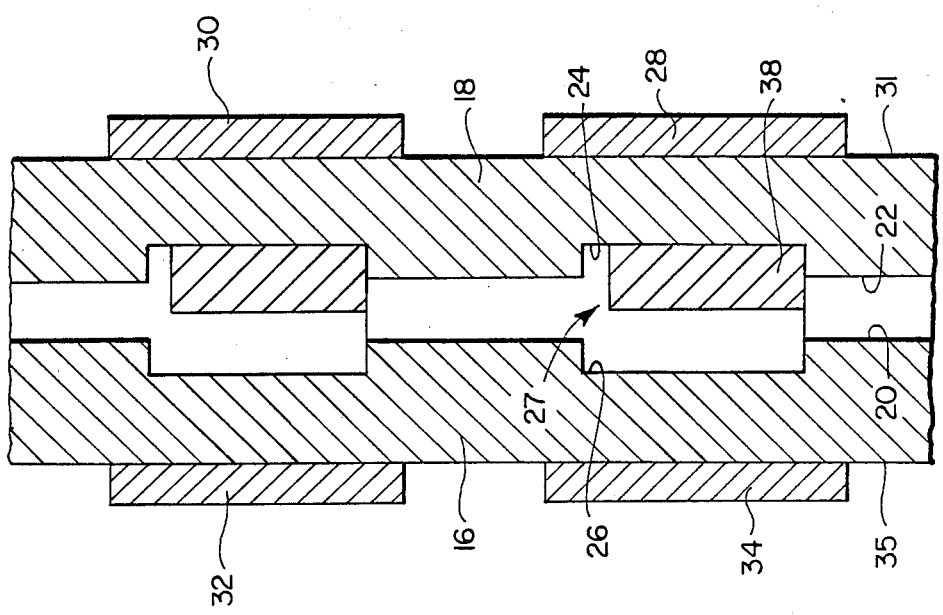

HEAT PIPE COOLED ELECTRONIC CIRCUIT CARD

FIELD OF THE INVENTION

The present invention relates to electronic circuit cards, and more particularly to such cards in which heat pipe technology is used to dissipate heat therefrom.

BACKGROUND OF THE INVENTION

In many electronic systems, particularly those carried in vehicles such as aircraft where high-density packaging prevails because of space limitations, the efficient cooling of electronic components has become a significant problem. With the advent of large-scale integrated circuit (IC) modules containing many thousands of circuit elements, it has become possible to pack great numbers of electronic components together within a very small volume. As is well known, these integrated circuit modules generate significant amounts of heat during the course of their normal operation. Since most solid state devices are sensitive to excessive temperatures, a solution to the problem of the generation of heat by large scale IC's in close proximity to one another has become of increasing concern to industry.

A typical approach to cooling components in electronic systems in which devices containing integrated circuits are placed on circuit cards is to direct a stream of cooling air across the modules and/or cards. One of the principal disadvantages of this approach is that the air quality (moisture content, contamination, etc.) must be tightly controlled to inhibit corrosion, loss of cooling effectiveness, etc. This feature is necessary in the design of aircraft avionics in particular to assure system reliability. Cooling of components by this means necessitates a number of compromises to the overall system. These compromises include: high pressure drop; uniformity of component form factors; placing the components containing the integrated circuits further apart on the circuit cards; increasing the distance between circuit cards; and increasing the volume and velocity of cooling air directed over the components, which increase requires special considerations in the design of the housings containing the circuit cards and in the mechanical systems for delivering the cooling air.

Increases in the sophistication of electronic systems has brought about denser packaging of electronic components with attendant increases in power density and total card power. This has brought about the evolution of another technique which is a further conventional approach to cooling of card-mounted electronic components. This technique utilizes solid metal thermal mounting cards or plates which conduct the heat dissipated by electronic components to a heat sink disposed at the edge of each card. Such an approach, however, results in a large thermal resistance from the component mounting surface to the heat sink, which causes high component temperatures. In an effort to mitigate this problem with metal cards, the prior art has turned to heat pipe technology.

Heat pipes per se are, of course, well known, as are solid metal circuit cards or boards for mounting electronic components. In the prior art there are also teachings of metal circuit cards incorporating heat pipes for dissipating the heat generated by electronic components mounted on the cards.

BRIEF DESCRIPTION OF THE INVENTION

This invention relates to a circuit card capable of high-density packaging of electronic components and is particularly designed for use in high-power density card racks in computers and other electronic and avionic systems. A solid metal is used for the card upon which the components are mounted and heat pipes are incorporated in the card. Each heat pipe is independent from the others on the card and they generally resemble a U-shaped configuration including a horizontal leg and two vertical legs. The horizontal leg of the heat pipe constitutes an evaporator section while the vertical legs represent condenser sections. The condenser sections are arranged to coincide with card retainers so that a number of cards may be stacked within a single housing. The short thermal path between the coincidence of the retainers and the condenser sections minimizes the thermal path to a heat sink to which the retainers are normally secured. Further, this orientation of a heat pipe allows it to operate in a gravity-assisting mode whenever the card is located in an upright orientation whereby condensate is gravity-fed back to a horizontal evaporator section for increased cooling efficiency. For operation in a non-upright condition, a wick is provided in each heat pipe to assure fluid transport. Accordingly, each heat pipe comprises a pipe-like sealed chamber charged with a vaporizeable liquid of two main regions comprising: (1) an evaporator section in which the working liquid is vaporized by the input heat, and (2) a condenser section where the vapor gives up heat and is condensed to liquid. The presence of a wick absorbs liquid and aids in condensate collection. Also, the liquid transport from condenser to evaporator sections is aided by the wick which extends throughout the length of the U-shaped heat pipe.

By virtue of the present invention, improved thermal conductivity is realizable with the attendant advantage of insensitivity with respect to gravity.

BRIEF DESCRIPTION OF THE FIGURES

The above-mentioned objects and advantages of the present invention will be more clearly understood when considered in conjunction with the accompanying drawings, in which:

FIG. 1 is a front elevation view of a retained module in accordance with the present invention;

FIG. 2 is a perspective view showing the interior surfaces of circuit cards having heat pipe grooves formed therein;

FIG. 3 is a partial sectional view illustrating the disposition of two die-cast congruent cards each having one-half of a heat pipe formed therein;

FIG. 4 is a partial sectional view illustrating the fused congruent cards of FIG. 3.

DETAILED DESCRIPTION OF THE INVENTION

FIG. 1 shows a module 10 to which are attached electronic components such as IC's, which are not illustrated to enhance the clarity of the figure. As will be explained hereinafter, each module is comprised of two congruent halves that are edge mounted to retainers 12 and 14. In FIG. 2, the congruent halves are seen to comprise metal cards 16 and 18, preferably fabricated from aluminum and typically 1/16 inch in thickness. FIG. 2 illustrates the inner surface views of the cards wherein the inner surface 20 of card 16 is seen to be planar with two generally U-shaped grooves 26 formed therein. The two grooves are merely illustrated for convenience and it is to be understood that a lesser or greater number is possible. Similarly, U-shaped grooves 24 are formed within the planar surface 22 of card 18. When the interior surfaces are positioned in abutment, each of the U-shaped grooves 24 becomes congruent with a corresponding groove 26 so that a pipe-like sealed chamber is effectively created through the interior interface of the two mating cards 16 and 18. A two-phase liquid must be deposited within each of the grooves so that a heat pipe results. The resulting heat pipe is generally indicated by reference numeral 27 is FIG. 1. By fusing the interior surfaces 20 and 22 of respective cards 16 and 18, each heat pipe comprises a pipe-like sealed chamber charged with the vaporizeable two-phase liquid. The illustrated bight section of the U-shaped heat pipe serves as an evaporator section while the parallel legs comprise condenser sections which coincide with the retainers 12 and 14. In the evaporator section the working liquid is vaporized by input heat while in the condenser section the vapor gives up heat and is condensed to liquid. Wicks 38, typically of stainless steel or nickel-based metal, are positioned along the length of each heat pipe to aid condensate collection and distribution to the evaporator section in the event the module 10 becomes positioned in a non-upright position as viewed in the figures. The condenser sections are positioned along the normally vertical edges of the module (coincident with retainers 12 and 14) so as to effectuate gravity assistance for directing liquid flow to the median evaporator section when the module 10 is located in an upright position. Thus, regardless of the module's position, operation of each heat pipe is gravity-insensitive.

FIG. 3 illustrates the congruent near-abutting disassembled metal cards 16 and 18. In FIG. 3 the interior surfaces 20 and 22 of respective cards 16 and 18 will finally be fused together as shown in FIG. 4 so that sealed heat pipes 27 are produced with wicks 38 positioned therein.

As illustrated in FIG. 3, electronic components 28, 30, 32, and 34 (not part of the invention) are mounted to the exterior surfaces 35 and 31 of the cards forming module 10. Preferably, these components are mounted in alignment with the heat pipes so that minimal thermal paths are created between the components and retainers 12 and 14. It should be understood that retainers 12 and 14 are normally attached to heat sinks which form part of a housing assembly which does not, per se, form part of the present invention.

Although the present invention has been described and illustrated with grooves die-cast within the cards 16 and 18, it is understood that the grooves in each card may be produced by deforming the metal cards and appropriate metal working process dependent upon card thickness and material.

According to the preceding description of the invention, it will be realized that an improved electronic metal module is produced which lowers the thermal resistance between electronic circuits and module retainers, the advantages of the present invention becoming realizable while being gravity-insensitive.

It should be understood that the invention is not limited to the exact details of construction shown and described herein for obvious modifications will occur to persons skilled in the art.

We claim:
1. An electronic component module comprising:
a first metal card having a plurality of parallel spaced and generally U-shaped grooves formed within a first interior surface thereof;
a second metal card having a plurality of parallel spaced and generally U-shaped grooves formed within a first interior surface thereof;
the first surfaces of each card being attached to the other and the grooves being respectively congruent to form corresponding independent parallel spaced U-shaped sealed heat pipes each having a central section acting as an evaporator section and two parallel legs serving as condenser sections;
a single wick located along the length of each pipe to assist in liquid transport along the pipe;
a two-phase vaporizable liquid present in each heat pipe; and
means contacting the edges of the module for retaining the module in place while being in coincidence with the heat pipe condenser sections for minimizing the thermal resistance of a retained module.

* * * * *